(12) United States Patent
Ai et al.

(10) Patent No.: US 12,087,782 B2
(45) Date of Patent: Sep. 10, 2024

(54) ARRAY SUBSTRATE, DISPLAY PANEL, AND ELECTRONIC DEVICE

(71) Applicant: WUHAN CHINA STAR OPTOELECTRONICS TECHNOLOGY CO., LTD., Wuhan (CN)

(72) Inventors: Fei Ai, Wuhan (CN); Jiyue Song, Wuhan (CN); Dewei Song, Wuhan (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 785 days.

(21) Appl. No.: 17/260,982

(22) PCT Filed: Nov. 24, 2020

(86) PCT No.: PCT/CN2020/131049
§ 371 (c)(1),
(2) Date: Jan. 15, 2021

(87) PCT Pub. No.: WO2022/088326
PCT Pub. Date: May 5, 2022

(65) Prior Publication Data
US 2022/0399383 A1    Dec. 15, 2022

(30) Foreign Application Priority Data
Oct. 28, 2020 (CN) .......................... 202011175784.3

(51) Int. Cl.
*H01L 27/146* (2006.01)
*G02F 1/1343* (2006.01)
(Continued)

(52) U.S. Cl.
CPC .... *H01L 27/14603* (2013.01); *G02F 1/13439* (2013.01); *G02F 1/136227* (2013.01);
(Continued)

(58) Field of Classification Search
CPC ......... H01L 27/14603; H01L 27/14692; H01L 27/14612; H01L 27/14643;
(Continued)

(56) References Cited

U.S. PATENT DOCUMENTS 9,871,061 B2    1/2018  Choi
2010/0171122 A1*  7/2010  Eguchi ............. H01L 27/14665
                                              257/66
(Continued)

FOREIGN PATENT DOCUMENTS

CN    107480639 A    12/2017
CN    108365050 A    8/2018
(Continued)

*Primary Examiner* — Shahed Ahmed
(74) *Attorney, Agent, or Firm* — PV IP PC; Wei Te Chung (57) ABSTRACT

An array substrate, a display panel, and an electronic device are provided. The array substrate includes a substrate, a first conductive layer including a first connection part, a fourth insulating layer disposed on the first conductive layer and provided with a second via, and a second conductive layer disposed on the fourth insulating layer and in the second via. The second conductive layer includes a second electrode, and the second electrode is connected to the first connection part through the second via.

19 Claims, 4 Drawing Sheets

(51) Int. Cl.
  *G02F 1/1362* (2006.01)
  *G02F 1/1368* (2006.01)
  *G06F 3/041* (2006.01)
  *G06V 40/13* (2022.01)

(52) U.S. Cl.
  CPC .. H01L 27/14692 (2013.01); *G02F 1/134363* (2013.01); *G02F 1/13685* (2021.01); *G06F 3/0412* (2013.01); *G06V 40/1318* (2022.01); *H01L 27/14612* (2013.01); *H01L 27/14643* (2013.01)

(58) Field of Classification Search
  CPC ..... H01L 27/1214–1296; H01L 29/868; H01L 2924/12031; H01L 2924/1204; G02F 1/13439; G02F 1/136227; H10K 59/10–221; H10K 59/131–1315
  See application file for complete search history.

(56) References Cited

U.S. PATENT DOCUMENTS

2013/0221230 A1* 8/2013 Tredwell ........... H01L 27/14663
  438/69
2021/0042493 A1* 2/2021 Lius .................... G09G 3/3208

FOREIGN PATENT DOCUMENTS

| CN | 109188811 A | 1/2019 |
| CN | 111708203 A | 9/2020 |
| CN | 111781777 A | 10/2020 |

\* cited by examiner

ARRAY SUBSTRATE, DISPLAY PANEL, AND ELECTRONIC DEVICE

RELATED APPLICATIONS

This application is a Notional Phase of PCT Patent Application No. PCT/CN2020/131049 having international filing date of Nov. 24, 2020, which claims the benefit of priority of Chinese Patent Application No. 202011175784.3 filed on Oct. 28, 2020. The contents of the above applications are all incorporated by reference as if fully set forth herein in their entirety.

FIELD OF INVENTION

The present invention relates to the field of display technologies, in particular to an array substrate, a display panel, and an electronic device.

BACKGROUND OF INVENTION

Combination of optical fingerprint technologies and display panels is currently one of main directions. Its principle is to use a difference in an intensity of light reflected by valleys and ridges of a fingerprint into a sensing area of the display panel to convert different optical signals into electrical signals. The electrical signals are extracted through a chip to form a key fingerprint pattern to achieve a fingerprint identification.

At present, the optical fingerprint technology applied to organic light emitting diodes is relatively extensive, but the optical fingerprint technology applied to liquid crystal display panels is rare. Due to limitations of backlight, aperture ratio, and other factors, optical sensors need to be fabricated on an array substrate. However, this will cause a depth of a via between an upper conductive layer and a lower metal part to be deeper, thereby increasing a process risk in exposure and etching processes and reducing stability of the optical sensor.

SUMMARY OF INVENTION

The present invention provides an array substrate, a display panel, and an electronic device, which can reduce a process risk in exposure and etching processes and improve stability of an optical sensor.

The present invention provides an array substrate, comprising: a substrate comprising a control component; a third metal layer disposed on the substrate, wherein the third metal layer comprises a first electrode and a first metal part, and the first electrode is connected to the control element through a first via; a PIN diode disposed on the first electrode, wherein the PIN diode comprises a first semiconductor layer and an intrinsic semiconductor layer; a third insulating layer disposed on the PIN diode; a first conductive layer disposed on the third insulating layer, wherein the first conductive layer comprises a first connection part, and the first connection part is connected to the first metal part; a fourth insulating layer disposed on the first conductive layer, wherein the fourth insulating layer is provided with a second via; and a second conductive layer disposed on the fourth insulating layer and in the second via, wherein the second conductive layer comprises a second electrode, and the second electrode covers the PIN diode, and the second electrode is connected to the first connecting portion through the second via.

The present invention further provides a display panel comprising the above-mentioned array substrate.

The present invention further provides an electronic device comprising the above-mentioned display panel.

The array substrate, the display panel, and the electronic device of the present invention comprise a substrate comprising a control component; a third metal layer disposed on the substrate, wherein the third metal layer comprises a first electrode and a first metal part, and the first electrode is connected to the control element through a first via; a PIN diode disposed on the first electrode, wherein the PIN diode comprises a first semiconductor layer and an intrinsic semiconductor layer; a third insulating layer disposed on the PIN diode; a first conductive layer disposed on the third insulating layer, wherein the first conductive layer comprises a first connection part, and the first connection part is connected to the first metal part; a fourth insulating layer disposed on the first conductive layer, wherein the fourth insulating layer is provided with a second via; and a second conductive layer disposed on the fourth insulating layer and in the second via, wherein the second conductive layer comprises a second electrode, the second electrode covers the PIN diode, and the second electrode is connected to the first connecting portion through the second via. Therefore, a depth of the connection hole between the second electrode and the first metal part can be reduced, thereby reducing a process risk caused by a difference in depth and shallow holes during exposure and etching. This improves stability and process feasibility of a manufacturing process, thereby improving stability of an optical sensor.

DETAILED DESCRIPTION OF PREFERRED EMBODIMENTS

The description of the following embodiments refers to the attached drawings to illustrate specific embodiments that the present invention can be implemented. The directional terms mentioned in the present invention, such as "up", "down", "front", "back", "left", "right", "inside", "outside", "side", etc., are just directions for referring to the attached drawings. Therefore, the directional terms used are used to describe and understand the present invention, rather than to limit the present invention. In the figures, units with similar structures are indicated by the same reference numerals.

The terms "first" and "second" in the description and claims of the present invention and the above-mentioned drawings are used to distinguish different objects, rather than to describe a specific sequence. In addition, the terms "including" and "having" and any variations thereof are intended to cover non-exclusive inclusions.

Figure 1:
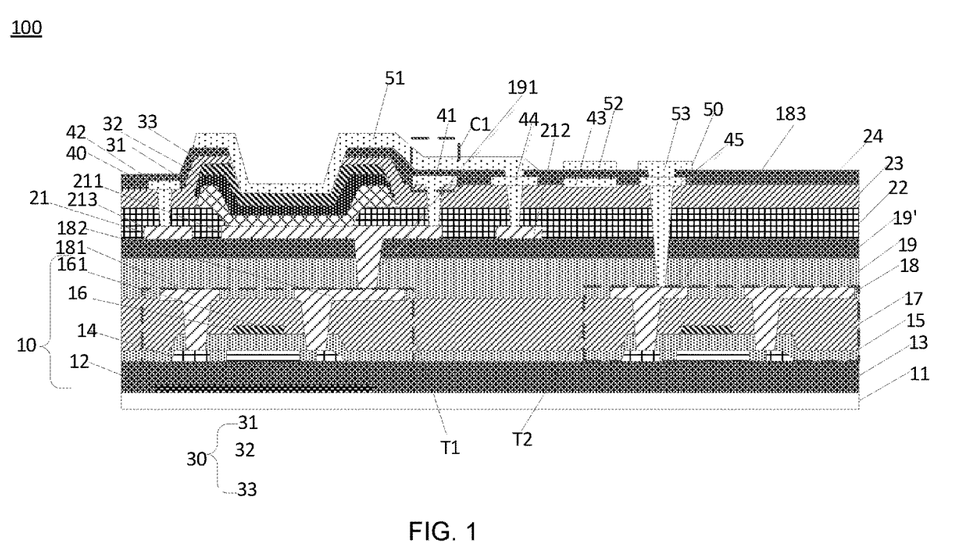
FIG. 1 is a schematic cross-sectional view of an array substrate according to an embodiment of the present invention.
Figure 2:
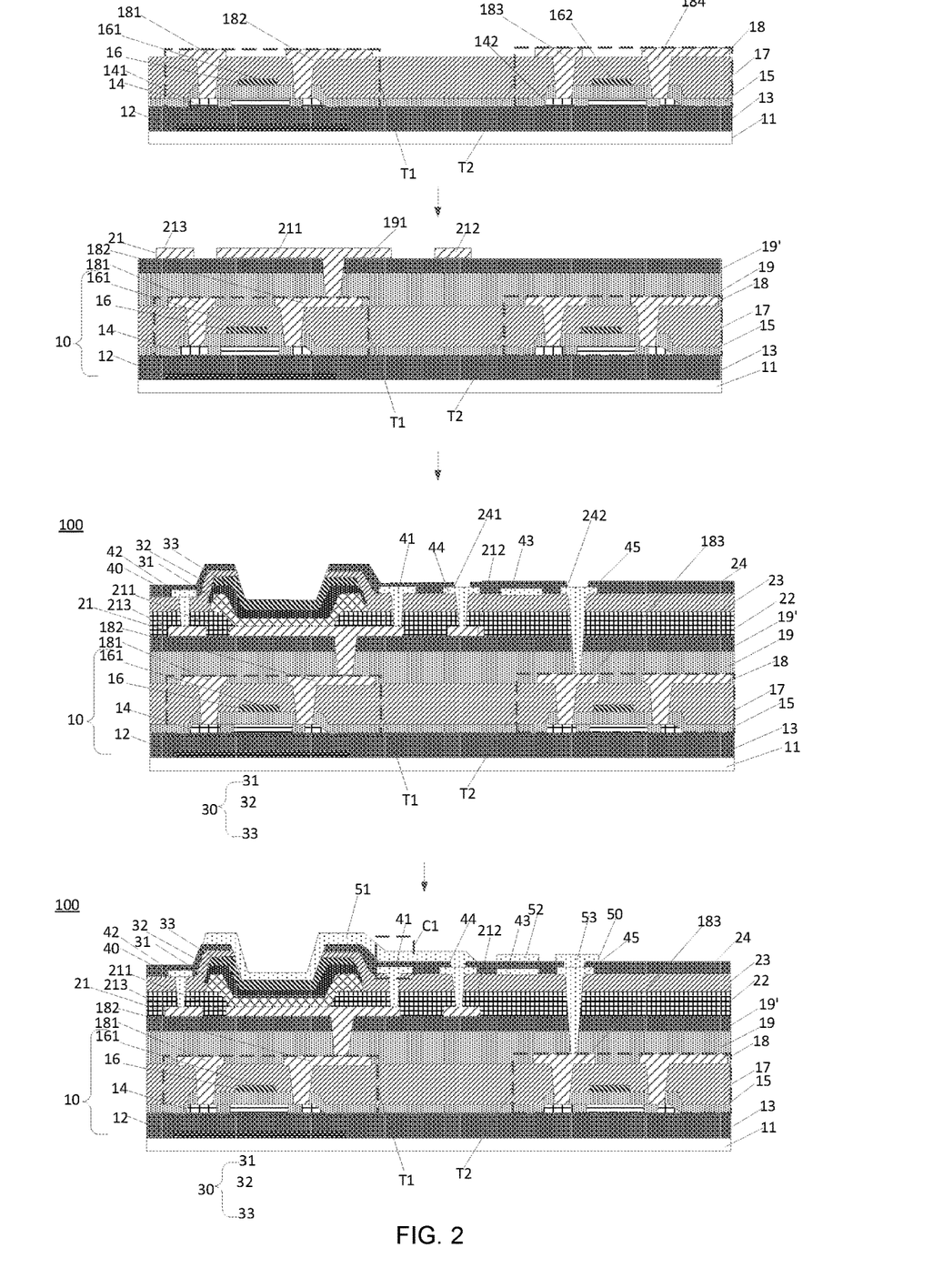
FIG. 2 is a flowchart of a manufacturing process of the array substrate illustrated in FIG. 1.
Figure 3:
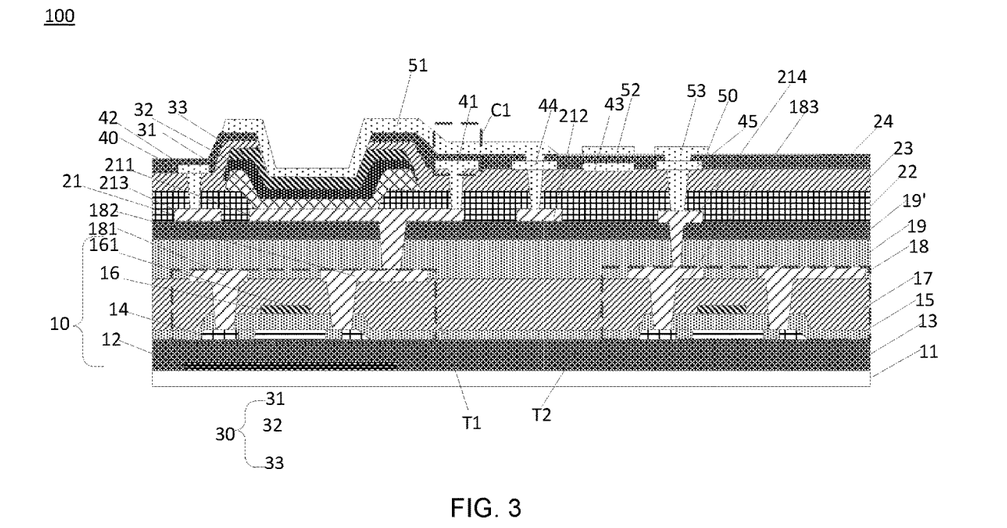
FIG. 3 is a schematic cross-sectional view of an array substrate according to another embodiment of the present invention.

Referring to FIG. 1 to FIG. 3, FIG. 1 is a schematic cross-sectional view of an array substrate according to an embodiment of the present invention.

As illustrated in FIG. 1, the array substrate 100 of this embodiment includes a substrate 10, a third metal layer 21, a PIN diode 30, a first conductive layer 40, a fourth insulating layer 24, and a second conductive layer 50.

The substrate 10 includes a control element T1, and the control element T1 is also a thin film transistor. In an embodiment, the substrate 10 may include a base substrate 11, a first semiconductor layer 14, a first insulating layer 15, a first metal layer 16, and a second metal layer 18. In addition, the substrate 10 may further include at least one of a light shielding layer 12, a buffer layer 13, a gate insulating layer 17, a planarization layer 19, and a passivation layer 19'.

The base substrate 11 may be a glass substrate or a flexible substrate. Material of the base substrate 11 includes one or more of glass, silicon dioxide, polyethylene, polypropylene, polystyrene, polylactic acid, polyethylene terephthalate, polyimide, or polyurethane.

The light shielding layer 12 is disposed on the base substrate 11, and material of the light shielding layer 12 may be a metal material.

The buffer layer 13 is disposed on the light shielding layer 12, and material of the buffer layer 13 includes, but is not limited to, silicon nitride or silicon oxide.

The active layer 14 is disposed on the buffer layer 13. In a preferred embodiment, material of the active layer 14 includes polysilicon. With reference to FIG. 2, the active layer 14 may include a first semiconductor part 141.

The first insulating layer 15 is disposed on the active layer 14, material of the first insulating layer 15 may include at least one of silicon nitride, silicon oxide, and organic photoresist.

The first metal layer 16 is disposed on the first insulating layer 15, the first metal layer 16 includes a first gate 161. Material of the first metal layer 16 may include at least one of copper, aluminum, and titanium.

The gate insulating layer 17 is disposed on the first metal layer 16, and material of the gate insulating layer 17 may include at least one of silicon nitride and silicon oxide.

The second metal layer 18 is disposed on the gate insulating layer 17, and the second metal layer 18 includes a first source 181 and a first drain 182. Material of the second metal layer 18 may be the same as material of the first metal layer 16.

The planarization layer 19 is disposed on the second metal layer 18, and material of the planarization layer 19 may include at least one of silicon nitride, silicon oxide, and organic photoresist. In a preferred embodiment, material of the planarization layer 19 includes an organic photoresist.

The passivation layer 19' is disposed on the planarization layer 19. Material of the passivation layer 19' may include at least one of silicon nitride, silicon oxide, and organic photoresist.

The third metal layer 21 is disposed on the passivation layer 19', and the third metal layer 21 includes a first electrode 211 and a first metal part 212. The first electrode 211 is connected to the control element T1 through a first via 191. In details, the first electrode 211 is connected to the first drain 182.

Material of the third metal layer 21 may include at least one of Ti/Al/Ti, Mo, Mo/Cu, and Mo/Al/Mo. Material of the third metal layer 21 is not limited to this. In one embodiment, in order to improve sensitivity of a photosensitive sensor, an area of an orthographic projection of the first electrode 211 on the substrate 10 is greater than an area of an orthographic projection of the PIN diode 30 on the substrate 10. That is, the PIN diode 30 partially covers the first electrode 211. The PIN diode 30 covers at least a part of the first semiconductor part 141. In a preferred embodiment, in order to further increase an aperture ratio, the PIN diode 30 completely covers the first semiconductor part 141. That is, the PIN diode 30 covers at least a part of the first semiconductor part 141 and a part of the first electrode 211.

The PIN diode 30 is disposed on the first electrode 211. The PIN diode 30 includes a first semiconductor layer 31, an intrinsic semiconductor layer 32, and a second semiconductor layer 33. The intrinsic semiconductor layer 32 and the second semiconductor layer 33 are sequentially disposed on the first semiconductor layer 31. In one embodiment, material of the first semiconductor layer 31 includes N-type amorphous silicon (N+a-Si). Material of the intrinsic semiconductor layer 32 includes amorphous silicon (a-Si). Material of the second semiconductor layer 33 includes P-type amorphous silicon (P+a-Si). In a preferred embodiment, material of the semiconductor layer of the control element T1 includes polysilicon, and material of the intrinsic semiconductor layer 32 includes amorphous silicon. Because amorphous silicon can be made relatively thick, it is good for light absorption and facilitates formation of high-performance photosensitive sensors. Therefore, accuracy of fingerprint recognition is improved. In other embodiments, the PIN diode 30 may not include the second semiconductor layer 33. That is, the PIN diode 30 includes a first semiconductor layer 31 and an intrinsic semiconductor layer 32.

The third insulating layer 23 is disposed on the PIN diode, and material of the third insulating layer 23 may also include at least one of silicon nitride, silicon oxide, and organic photoresist.

The first conductive layer 40 is disposed on the third insulating layer. The first conductive layer 40 includes a first connection part 44 connected to the first metal part 212. In one embodiment, in order to reduce impedance of the first electrode, the first conductive layer 40 may further include a first electrode plate 41, and the first electrode plate 41 is connected to the first electrode 211. It can be understood that, in other embodiments, the first conductive layer 40 may not include the first electrode plate. In one embodiment, material of the first conductive layer 40 includes but is not limited to indium tin oxide. In another embodiment, the first conductive layer 40 further includes a second connection part 45 connected to a drain 183 of a switch element T2. In one embodiment, in order to reduce impedance of the first electrode, the first conductive layer 40 further includes a first electrode plate 41, and the first electrode plate 41 is connected to the first electrode 211. It can be understood that, in other embodiments, the first conductive layer 40 may not include the first electrode plate. In one embodiment, material of the first conductive layer 40 includes but is not limited to indium tin oxide. In one embodiment, a position of an orthographic projection of the first conductive layer 40 on the substrate 10 and a position of an orthographic projection of the PIN diode 30 on the substrate 10 do not overlap.

The fourth insulating layer 24 is disposed on the first conductive layer 40. With reference to FIG. 2, a second via 241 is provided on the fourth insulating layer 24. In another embodiment, the fourth insulating layer 24 is further provided with a third via 242. Material of the fourth insulating layer 24 may also include at least one of silicon nitride, silicon oxide, and organic photoresist. A first opening (not shown in the figure) is provided on the fourth insulating layer 24, and the first opening is used to connect the second electrode 51 and the PIN diode 30. That is, the first opening is used to expose part of the PIN diode 30 to the outside.

The second conductive layer 50 is disposed on the PIN diode 30, and the second conductive layer 50 includes a second electrode 51. The second electrode 51 covers the PIN diode 30. With reference to FIG. 2, the second electrode 51 is connected to the first connection part 44 through the second via 241. That is, the second electrode 51 is connected to the first metal part 212 through the first connection part 44. In one embodiment, material of the second conductive layer 50 includes but is not limited to indium tin oxide. In addition, the first metal part 212 can be used as a voltage access point of the second electrode 51, so that a driving chip can input voltage to the second electrode 51 through the first metal part 212. This shortens a length of a connection line between the second electrode 51 and the driving chip, reduces voltage loss, and further improves sensitivity of the photosensitive sensor. In addition, in an embodiment, the second electrode 51 may also cover part or all of the first metal part 212. In one embodiment, part of the second electrode 51 is located in the first opening.

In another embodiment, the substrate 10 further includes a switch element T2, and the switch element T2 includes a third drain 183. The second conductive layer 50 further includes a pixel electrode 53. The pixel electrode 53 is connected to the second connection part 45 through the third via 242, thereby further reducing a depth of the via between the pixel electrode and the third drain. This reduces a process risk caused by a difference in depth and shallow holes in exposure and etching processes, improves stability and process feasibility of the process, and further improves stability of an optical sensor.

In a preferred embodiment, in order to further reduce impedance of the connection line, the pixel electrode 53 covers the second connection part 45. That is, an orthographic projection area of the pixel electrode 53 on the substrate is greater than or equal to an orthographic projection area of the second connection part 45 on the substrate.

In one embodiment, in order to further improve sensitivity of the photosensitive sensor, the second electrode 51 covers the first electrode 211 and the first electrode plate 41. That is, an area of an orthographic projection of the second electrode 51 on the substrate is greater than a sum of an area of an orthographic projection of the first electrode 211 on the substrate and an area of an orthographic projection of the first electrode plate 41 on the substrate. The array substrate 100 may further include a second electrode plate. The second electrode plate is a part of the second electrode 51 corresponding to the position of the first electrode plate 41 (not shown in the figure). The second electrode plate and the first electrode plate 41 form a storage capacitor C1.

In another embodiment, in order to further improve an integration degree of the array substrate and reduce an overall thickness, the third metal layer 21 further includes a common electrode 213. The first conductive layer 40 further includes a touch electrode line 42. The position of the common electrode 213 corresponds to the position of the touch electrode line 42, and the common electrode 213 is connected to the touch electrode line 42. In one embodiment, material of the first conductive layer 30 includes but is not limited to indium tin oxide. The touch electrode line 42 here is also used as an access point for the common voltage.

In one embodiment, in order to simplify a manufacturing process and reduce production cost, the first conductive layer 40 further includes a third electrode plate 43. The second conductive layer 50 further includes a fourth electrode plate 52, wherein the fourth electrode plate 52 and the third electrode plate 43 are positioned correspondingly to form a pixel capacitor.

In a preferred embodiment, the third drain 183 is located on the second metal layer 18. That is, the drain and source of the switch element T2 are made in the same layer as the source and drain of the control element T1, respectively. In addition, a gate of the switch element T2 can be made in the same layer as a gate of the control element T1. An active layer of the switch element T2 can also be made in the same layer as the active layer of the control element Ti.

In addition, in an embodiment, the aforementioned array substrate 100 may further include a second insulating layer 22.

The second insulating layer 22 is disposed between the third metal layer 21 and the first semiconductor layer 31. Material of the second insulating layer 22 may include at least one of silicon nitride, silicon oxide, and organic photoresist. A second opening (not shown in the figure) is provided on the second insulating layer 22, and the position of the second opening corresponds to the position of the first opening. The first opening is used to connect the PIN diode 30 and the first electrode 211. The PIN diode 30 may be located in the first opening and cover a part of the second insulating layer 22. In one embodiment, an area of the second opening is greater than an area of the first opening, or a width of the second opening is greater than a width of the first opening. In order to facilitate the connection of the PIN diode 30 with the first electrode 211, the position of the second opening corresponds to the position of the first electrode 211.

The third insulating layer 23 is disposed between the PIN diode 30 and the first conductive layer 40, and material of the third insulating layer 23 may also include at least one of silicon nitride, silicon oxide, and organic photoresist.

The photosensitive sensor includes a PIN diode 30, a first electrode, and a second electrode. Because the photosensitive sensor is fabricated on the control element T1 and the PIN diode 30 covers at least part of the active layer of the control element, the photosensitive sensor also covers at least part of the active layer of the control element. Therefore, an aperture ratio is increased, thereby improving accuracy of fingerprint recognition. In addition, because a light absorption coefficient of a photosensitive layer of amorphous silicon is much better than that of polysilicon, sensitivity of the photosensitive sensor is increased.

Because the second electrode is connected to the first connection part through the second via, a depth of a connection hole between the second electrode and the first metal part can be reduced. This reduces a process risk caused by a difference in depth and shallow holes during exposure and etching, improves stability and process feasibility of the process, and further improves stability of the optical sensor.

As illustrated in FIG. 2, in one embodiment, a manufacturing method of the array substrate of this embodiment includes:

S101, forming a light shielding layer 12 on the base substrate 11.

For example, the light shielding layer 12 is patterned by exposure and etching, so that the light shielding layer 12 shields the first semiconductor part 141.

S102, forming a buffer layer 13 and an active layer 14 on the light shielding layer 12 in sequence.

For example, amorphous silicon is deposited on the buffer layer 13, and after an excimer laser annealing, the active layer 14 of polysilicon is obtained. The active layer 14 is exposed and etched to form the first semiconductor part 141 and the second semiconductor part 142, respectively. The first semiconductor part 141 and the second semiconductor part 142 are respectively doped with P ions to form N+, so that the first semiconductor part 141 and the second semiconductor part 142 are easily in ohmic contact.

S103, sequentially depositing a first insulating layer 15 and a first metal layer 16 on the first semiconductor part and the second semiconductor part.

For example, the first metal layer 16 is patterned to form a first gate 161 and a third gate 162. Then, the first semiconductor part 141 and the second semiconductor part 142 are respectively implanted with N-ions using a self-aligned process.

S104, depositing a gate insulating layer 17 on the first metal layer 16.

For example, in one embodiment, the gate insulating layer 17 may be a SiNx/SiOx stacked structure. In one embodiment, rapid thermal annealing can be used for hydrogenation and activation. Then, the gate insulating layer 17 is exposed and etched to form a connection hole for the source and the drain. The connection hole is connected to the first semiconductor part 141 or the second semiconductor part 142.

S105, depositing a second metal layer in the connection hole and the gate insulating layer 17.

For example, the second metal layer 18 is patterned to form a first source 181 and a first drain 182, and a third drain 183 and a third source 184.

S106, forming a planarization layer 19 and a passivation layer 19' on the second metal layer 18 in sequence.

For example, the passivation layer 19' is provided with a first via 191, the first via 191 penetrates the passivation layer 19' and the planarization layer 19, and the first electrode 211 is connected to the first drain 182 through the first via 191.

S107, depositing a third metal layer 21 on the passivation layer 19'.

For example, the third metal layer 21 is patterned to form the first electrode 211, the first metal part 212, and the common electrode 213.

S108, depositing a second insulating layer 22 on the third metal layer 21.

S109, sequentially depositing the first semiconductor layer 31, the intrinsic semiconductor layer 32, and the second semiconductor layer 33 on the second insulating layer 22, and patterning them. In one embodiment, material of the first semiconductor layer 31 includes N-type amorphous silicon (N+a-Si), material of the intrinsic semiconductor layer 32 includes amorphous silicon (a-Si), and material of the second semiconductor layer 33 includes P-type amorphous silicon (P+a-Si).

S110, forming a third insulating layer 23 and a first conductive layer 40 on the second semiconductor layer 33 in sequence, and patterning the first conductive layer 40 to form the first electrode plate 41, the touch electrode line 42, the third electrode plate 43, the first connection part 44, and the second connection part 45.

A first connection hole, a second connection hole, and a third connection hole (none of which are shown in the figure) are made on the third insulating layer 23. The touch electrode line 42 is connected to the common electrode 213 through the first connection hole, the first electrode plate 41 is connected to the first electrode 211 through the second connection hole, and the first connecting portion 44 is connected to the first metal part 212 through the third connection hole. The first connection hole, the second connection hole, and the third connection hole all penetrate the third insulating layer 23 and the second insulating layer 22.

S111, depositing a fourth insulating layer 24 and a second conductive layer 50 on the first conductive layer 40 in sequence.

For example, the fourth insulating layer 24 is provided with a second via 241 and a third via 242, and the second via 241 is used to connect the second electrode 51 and the first connection portion 44.

The third via 242 is used to connect the pixel electrode 53 and the second connection part 45. The second connection part 45 is connected to the third drain 183.

A second conductive layer 50 is formed in the second via and the third via and on the fourth insulating layer 24, and the second conductive layer 50 is patterned to form the second electrode 51, the pixel electrode 53, and the fourth electrode plate 52.

The manufacturing method of the array substrate of the present embodiment includes all the technical solutions of the above-mentioned array substrate, and therefore can achieve all the above technical effects, which will not be repeated here.

In other embodiments, as illustrated in FIG. 3, the third metal layer 21 may further include an auxiliary part 214. The second connection part 45 is connected to the drain of the switch element T2 through the auxiliary part 214. This further reduces a depth of the via between the pixel electrode and the third drain, reduces a process risk caused by a difference in depth and shallow holes in exposure and etching processes, improves stability and process feasibility of the process, and thereby improves display performance.

The passivation layer 19' of this embodiment is further provided with a fourth via, wherein the auxiliary part 214 is connected to the third drain 183 through the fourth via.

The difference between the manufacturing method of the array substrate of this embodiment and the previous embodiment is:

The manufacturing method of this embodiment further includes: providing a fourth via on the passivation layer 19', wherein the auxiliary part 214 is connected to the third drain 183 through the fourth via.

Figure 4:
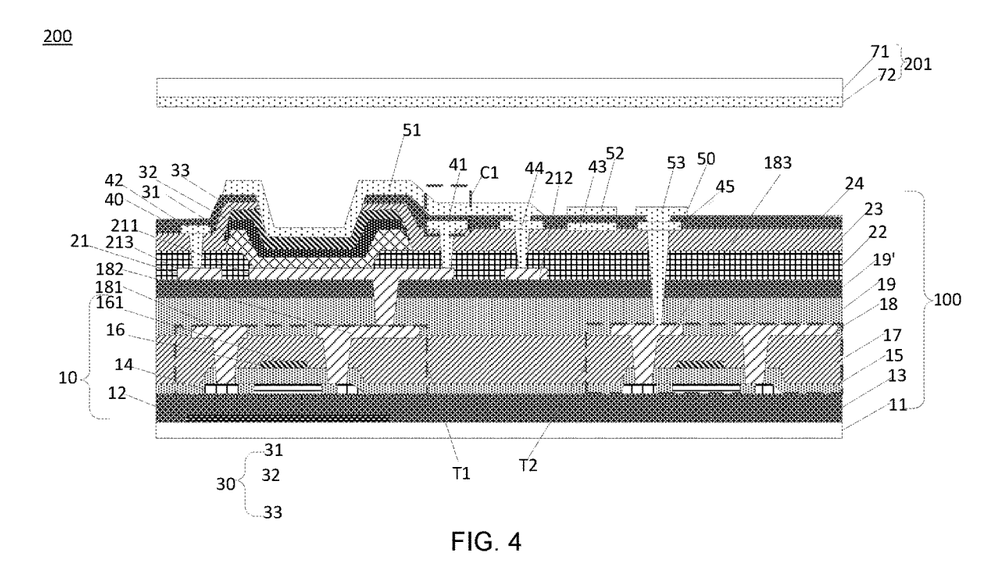
FIG. 4 is a schematic structural diagram of a display panel according to an embodiment of the invention.

As illustrated in FIG. 4, this embodiment also provides a display panel 200, which includes any of the above-mentioned array substrates 100. In addition, the display panel 200 may further include a second substrate 201. The second substrate 201 is disposed opposite to the array substrate 100. The display panel 200 may be a liquid crystal display panel. A liquid crystal layer (not shown in the figure) is also provided between the array substrate 100 and the second substrate 201. In addition, a sealant may be provided between the array substrate 100 and the second substrate 201 for bonding the array substrate 100 and the second substrate 201. In an embodiment, the second substrate 201 may include a second base substrate 71 and a second electrode 72. The second electrode 72 is provided on a side of the second base substrate 71 close to the array substrate. In another embodiment, the second substrate 201 may be a color filter substrate, that is, the second substrate 201 may further include a color filter layer. It can be understood that the structure of the second substrate 201 is not limited to this.

Figure 5:
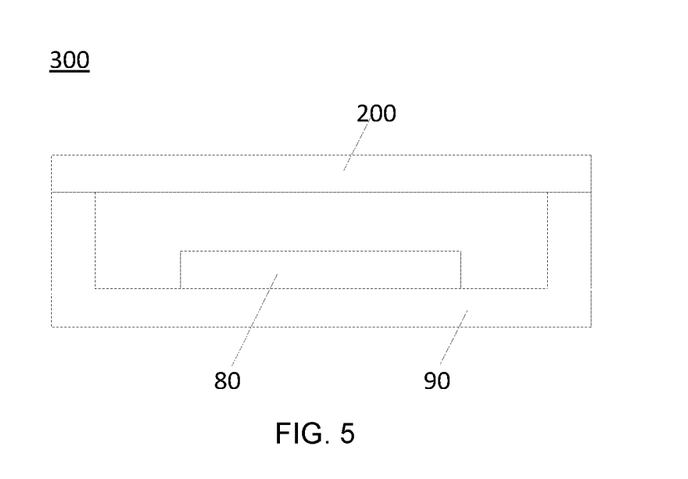
FIG. 5 is a schematic structural diagram of an electronic device according to an embodiment of the present invention.

Referring to FIG. 5, which is a schematic structural diagram of an electronic device according to the present invention.

The electronic device 300 may include a display panel 200, a control circuit 80, and a housing 90. It should be noted that the electronic device 300 illustrated in FIG. 5 is not limited to the above content, and may also include other devices, such as a camera, an antenna structure, a fingerprint unlocking module, and the like.

The display panel 200 is disposed on the housing 90.

In some embodiments, the display panel 200 may be fixed to the housing 90, and the display panel 200 and the housing 90 form a closed space to accommodate components such as the control circuit 80.

In some embodiments, the housing 90 may be made of a flexible material, such as a plastic housing or a silicone housing.

The control circuit 80 is installed in the housing 90. The control circuit 80 may be a main board of the electronic device 300. The control circuit 80 can be integrated with one, two, or more of functional components such as a battery, an antenna structure, a microphone, a speaker, a headphone interface, a universal serial bus interface, a camera, a distance sensor, an ambient light sensor, a receiver, and a processor.

The display panel 200 is installed in the housing 90. Further, the display panel 200 is electrically connected to the control circuit 80 to form a display surface of the electronic device 300. The display panel 200 may include a display area and a non-display area. The display area can be used to display a screen of the electronic device 300 or for the user to perform touch manipulation. This non-display area can be used to set various functional components.

The electronic device includes, but is not limited to, a mobile phone, a tablet computer, a computer monitor, a game console, a television, a display screen, a wearable device, and other household appliance or household appliance with display functions.

The array substrate, the display panel, and the electronic device of the present invention comprise a substrate comprising a control component; a third metal layer disposed on the substrate, wherein the third metal layer comprises a first electrode and a first metal part, and the first electrode is connected to the control element through a first via; a PIN diode disposed on the first electrode, wherein the PIN diode comprises a first semiconductor layer and an intrinsic semiconductor layer; a third insulating layer disposed on the PIN diode; a first conductive layer disposed on the third insulating layer, wherein the first conductive layer comprises a first connection part, and the first connection part is connected to the first metal part; a fourth insulating layer disposed on the first conductive layer, wherein the fourth insulating layer is provided with a second via; and a second conductive layer disposed on the fourth insulating layer and in the second via, wherein the second conductive layer comprises a second electrode, the second electrode covers the PIN diode, and the second electrode is connected to the first connecting portion through the second via. Therefore, a depth of the connection hole between the second electrode and the first metal part can be reduced, thereby reducing a process risk caused by a difference in depth and shallow holes during exposure and etching. This improves stability and process feasibility of a manufacturing process, thereby improving stability of an optical sensor.

The array substrate, the display panel, and the electronic device provided by the present invention are described in detail above. Specific examples are used in this article to illustrate the principle and implementation of the present invention. The description of the above embodiments is only used to help understand the present invention. At the same time, for those skilled in the art, according to the idea of the present invention, there will be changes in the specific implementation and the scope of the application. In summary, the content of this specification should not be construed as limiting the present invention.

What is claimed is:

1. An array substrate, comprising:
   a substrate comprising a control component;
   a third metal layer disposed on the substrate, wherein the third metal layer comprises a first electrode and a first metal part, and the first electrode is connected to the control element through a first via;
   a PIN diode disposed on the first electrode, wherein the PIN diode comprises a first semiconductor layer and an intrinsic semiconductor layer;
   a third insulating layer disposed on the PIN diode;
   a first conductive layer disposed on the third insulating layer, wherein the first conductive layer comprises a first connection part, and the first connection part is connected to the first metal part;
   a fourth insulating layer disposed on the first conductive layer, wherein the fourth insulating layer is provided with a second via; and
   a second conductive layer disposed on the fourth insulating layer and in the second via, wherein the second conductive layer comprises a second electrode, the second electrode covers the PIN diode, and the second electrode is connected to the first connection part through the second via;
   wherein:
   the substrate further comprises a switch element;
   the fourth insulating layer is further provided with a third via;
   the first conductive layer further comprises a second connection part, and the second connection part is connected to a drain of the switch element;
   the second conductive layer further comprises a pixel electrode, and the pixel electrode is connected to the second connection part through the third via.

2. The array substrate according to claim 1, wherein the pixel electrode covers the second connection part.

3. The array substrate according to claim 1, wherein the third metal layer further comprises an auxiliary part, and the second connection part is connected to the drain of the switch element through the auxiliary part.

4. The array substrate according to claim 3, wherein the substrate further comprises a passivation layer disposed between the third metal layer and the switch element, the passivation layer is provided with a fourth via, and the auxiliary part is connected to the drain of the switch element through the fourth via.

5. The array substrate according to claim 1, wherein a position of an orthographic projection of the first conductive layer on the substrate does not overlap with a position of an orthographic projection of the PIN diode on the substrate.

6. The array substrate according to claim 1, wherein the fourth insulating layer is provided with a first opening, and the first opening is configured to connect the second electrode and the PIN diode.

7. The array substrate according to claim 6, wherein the array substrate further comprises a second insulating layer, the second insulating layer is provided with a second opening, a position of the second opening corresponds to a position of the first opening, and the first opening is configured to connect the PIN diode and the first electrode.

8. The array substrate according to claim 7, wherein an area of the second opening is greater than an area of the first opening.

9. The array substrate according to claim 1, wherein the third insulating layer is provided with a third connection hole, and the first connection part is connected to the first metal part through the third connection hole.

10. The array substrate according to claim 1, wherein the third metal layer further comprises a common electrode, the first conductive layer further comprises a touch electrode line, a position of the common electrode corresponds to a position of the touch electrode line, and the common electrode is connected to the touch electrode line.

11. The array substrate according to claim 1, wherein:
the first conductive layer further comprises a third electrode plate;
the second conductive layer further comprises a fourth electrode plate, and a position of the third electrode plate corresponds to a position of the fourth electrode plate.

12. The array substrate according to claim 1, wherein the PIN diode covers at least a part of an active layer and a part of the first electrode of the control element.

13. The array substrate according to claim 1, wherein material of an active layer of the control element comprises polysilicon, and material of the intrinsic semiconductor layer comprises amorphous silicon.

14. The array substrate according to claim 1, wherein the PIN diode further comprises a second semiconductor layer, and the second semiconductor layer is disposed on the intrinsic semiconductor layer.

15. A display panel comprising the array substrate according to claim 1.

16. The display panel according to claim 15, wherein:
the substrate further comprises a switch element;
the fourth insulating layer is further provided with a third via;
the first conductive layer further comprises a second connection part, and the second connection part is connected to a drain of the switch element;
the second conductive layer further comprises a pixel electrode, and the pixel electrode is connected to the second connection part through the third via.

17. The display panel according to claim 16, wherein the pixel electrode covers the second connection part.

18. The display panel according to claim 16, wherein the third metal layer further comprises an auxiliary part, and the second connection part is connected to the drain of the switch element through the auxiliary part.

19. An electronic device comprising the display panel according to claim 15.

* * * * *